United States Patent [19]

Bock et al.

[11] Patent Number: 5,475,583
[45] Date of Patent: Dec. 12, 1995

[54] PROGRAMMABLE CONTROL SYSTEM INCLUDING A LOGIC MODULE AND A METHOD FOR PROGRAMMING

[75] Inventors: Gënther Bock; Helmut Macht, both of Kümmersbruck; Christof Wombacher, Amberg; Manfred Prechtl, Nabburg; Andre Lengemann, Edelsfeld, all of Germany

[73] Assignee: Siemens Aktiengesellschaft, München, Germany

[21] Appl. No.: 840,326

[22] Filed: Feb. 24, 1992

[30] Foreign Application Priority Data

Feb. 22, 1991 [DE] Germany .................. 41 05 678.7
Nov. 14, 1991 [EP] European Pat. Off. .......... 91119483

[51] Int. Cl.[6] .................................................. G05B 11/01
[52] U.S. Cl. ................................... 364/141; 364/490
[58] Field of Search ........................ 364/131–137, 364/474.11, 716, 736, 741, 488–491; 307/465–469; 395/800, 650

[56] References Cited

U.S. PATENT DOCUMENTS

| | | | |
|---|---|---|---|
| 4,124,899 | 11/1978 | Birkner et al. | 364/716 |
| 4,787,047 | 11/1988 | Wei | 364/716 |
| 4,845,633 | 7/1989 | Furteh | 364/490 |
| 4,858,101 | 8/1989 | Stewart et al. | 364/131 |
| 4,864,489 | 9/1989 | Yasuhara et al. | 364/131 |
| 4,876,466 | 10/1989 | Kondov et al. | 364/716 |
| 4,916,600 | 4/1990 | Ropelato | 364/131 |
| 4,982,340 | 1/1991 | Oyanngi et al. | 364/133 |
| 4,998,194 | 3/1991 | Okamoto et al. | 364/133 |
| 5,089,973 | 2/1992 | Furteh | 364/489 |
| 5,097,405 | 3/1992 | Sato | 364/131 |
| 5,119,289 | 6/1992 | Braun | 364/133 |
| 5,189,628 | 2/1993 | Olsen et al. | 364/716 |
| 5,280,202 | 1/1994 | Chan et al. | 307/465 |
| 5,301,100 | 4/1994 | Wagner | 364/141 |
| 5,349,691 | 9/1994 | Harrison et al. | 395/800 |

FOREIGN PATENT DOCUMENTS

| | | |
|---|---|---|
| 0285814 | 3/1988 | European Pat. Off. . |
| 0266065A2 | 5/1988 | European Pat. Off. . |
| 0489228A1 | 8/1991 | European Pat. Off. . |
| 58-211207 | 12/1983 | Japan . |
| WO84/02988 | 8/1984 | WIPO . |

OTHER PUBLICATIONS

Fletcher, "An engineering approach to digital Design" 1980, pp. 568–577.
Schenk, *Halbleiter–Schaltungs–technik*, pp. 306–310, date unknown.
Wratil, *Speicherprogrammierbare Steuerung in der Automatisierungstechnik*, pp. 78–79 (1989).

*Primary Examiner*—James P. Trammell
*Attorney, Agent, or Firm*—Kenyon & Kenyon

[57] ABSTRACT

A new storage-programmable control system having several inputs (8) and outputs (9) for linking process control elements, for example sensors or final controlling elements has at least one logic module (10) with an internal interconnection, through which at least one output is connected to its corresponding input (E0).

12 Claims, 14 Drawing Sheets

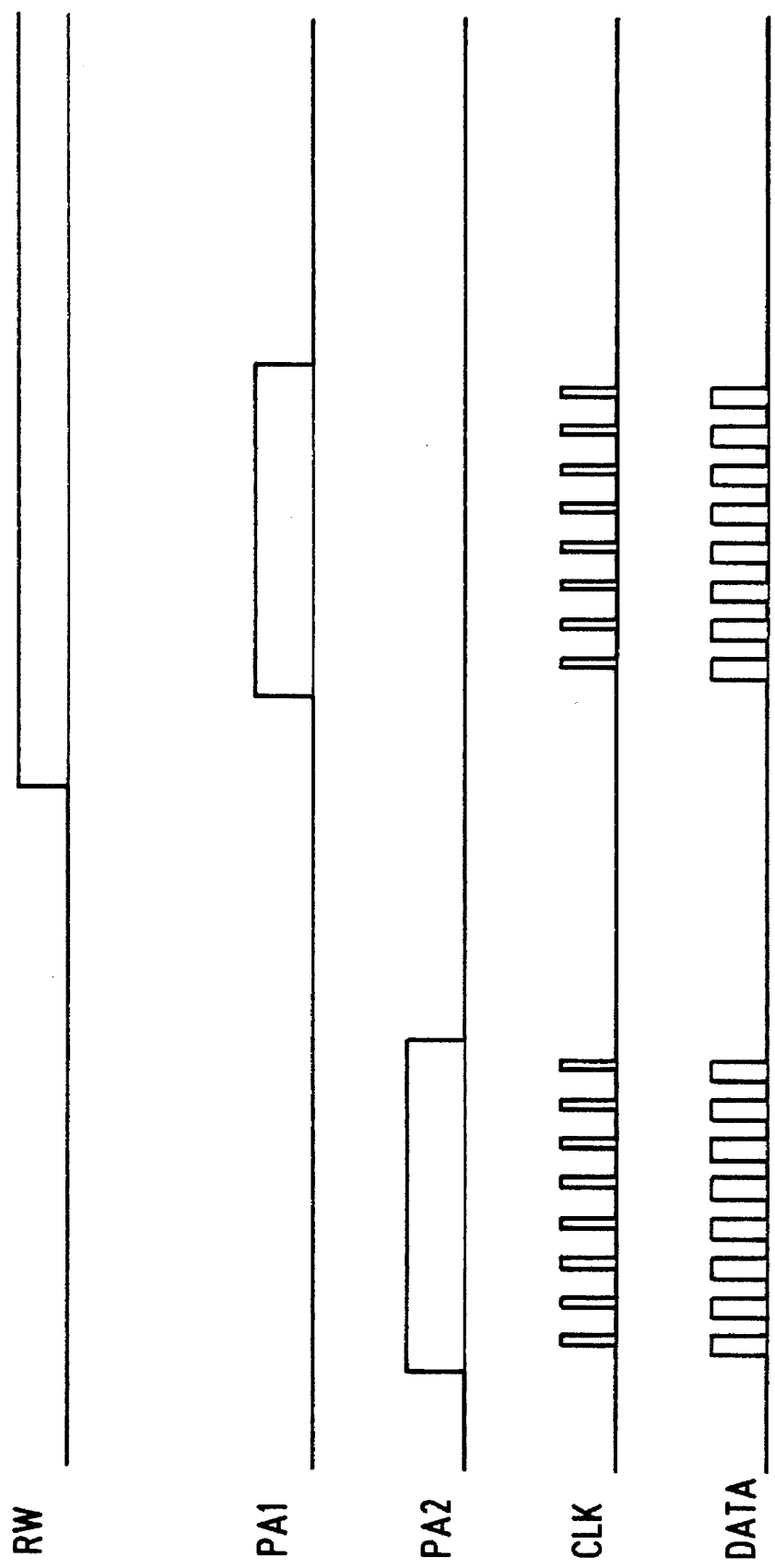

PROGRAMMABLE CONTROL SYSTEM INCLUDING A LOGIC MODULE AND A METHOD FOR PROGRAMMING

BACKGROUND OF THE INVENTION

The present invention relates to a storage-programmable control system having several inputs and outputs for linking process control elements, for example sensors or final controlling elements. The present invention also relates to a method for operating a storage-programmable control system and a method for the computer-controlled, internal electrical connection of a field-programmable gate array.

Formerly, machine controls used to be arranged in contactor technique. Contactor circuits work in parallel and therefore are fast. However, they are interference-prone, complicated, and tedious to assemble or adapt. Storage-programmable control systems have become widespread. They operate sequentially and their assembly and programming are considerably simpler than the prior machine controls. However, due to their sequential mode of operation, even modern programmable controls often do not operate fast enough (e.g., programmable controls for controlling packaging or labelling machines). In general, control systems for these machines requiring fast operation are still set up today based on logic elements which must be hard wired. Such hard-wired control systems offer a high processing speed. However, wiring the logic elements is very cumbersome and prone to errors.

The present invention provides a storage-programmable control system which can handle extremely fast control operations. Furthermore, the present invention provides a method which enables such a storage-programmable control system, containing a logic module with a field-programmable gate array, to be programmed quickly and simply.

SUMMARY OF THE INVENTION

By providing the control system of the present invention with at least one logic module having an internal interconnection connecting at least one output to its corresponding input, extremely fast control operations can be handled. In this manner, the output signal from this output is constantly adapted to the value of the corresponding input, so that a costly alarm response system, which would otherwise be necessary at this input, is no longer needed.

The logic module of the present invention is advantageously designed to operate in parallel, so that several inputs and outputs are connected to one another..As a result, the output signals from these outputs are not subject to- beat frequencies and fluctuations caused by the processing time and can therefore be stably reproduced.

By providing a programmable, and, preferably, a reprogrammable internal interconnection of the logic module, the control system can be easily adapted to altered requirements.

By providing the logic module with a static storage device for storing the conditions which stipulate its internal interconnection, programming the logic module is quite simple. In particular, the logic module can be a field-programmable gate array (FPGA).

By providing the control system with a modular design, the logic module is advantageously configured in an input/ output subassembly, since the control system's system bus would no longer be needed for data transfer. Here, allowing the logic module to be programmed directly on the subassembly (for example via an interface for connecting a data-input-output unit, whereby the interface acts directly or indirectly on the system bus or also on the logic module itself or via a plug-in-type user storage device, which establishes the internal interconnection of the logic module) is also advantageous.

The operation of the control system of the present invention enables at least one input signal to be read into a logic module and processed there, so that the logic module is capable of outputting an output signal corresponding to the input signal.

The present invention provides the following method which enables a storage-programmable control system to be programmed quickly and simply:

internal electrical configurations, including the connections and possibly the logic functions of the logic array, which effect the specified functional performance characteristics, are determined from specified functional performance characteristics, for example based on a specified functional circuit diagram, in particular a function diagram for a storage-programmable control system; and the determined internal electrical configuration, including the connections and possibly the logic functions, are applied to the logic array;

whereby, when the internal electrical connections are established, a portion of the internal electrical connections (which in principle are able to be freely established) is firmly stipulated independently of the specified total functional performance characteristics.

According to the method of the present invention, when the logic blocks are divided into groups by the firmly stipulated part of the internal electrical connections, (which at least: partly exhibit the same configurations) uniform structures are produced so that the logic field is quasi split up into smaller units, namely the groups. In this manner, splitting up the specified functional total performance characteristics into subfunctions, realizable, at least partially, in one group each of logic blocks is possible.

For standard subfunctions, in particular complex standard subfunctions, internal electrical standard configurations, thus connections and possibly also logic functions, can be specified, whereby the standard subfunctions can also be realized by more than one group of logic blocks.

When subfunctions and standard subfunctions are very simple, several of them can possibly be combined, provided that the combination can be realized in a group of logic blocks.

The logic array is then programmed by allocating the subfunctions and/or the standard subfunctions and/or the combination to the groups of logic blocks;

determining, in view of the firmly stipulated internal electrical connections, the internal electrical connections, which connect the groups of logic blocks to one another and to external connections such that the specified total functional performance characteristics are realized; and impressing the thus determined internal electrical connections on to the logic array, preferably together with the firmly stipulated internal electrical connections.

Programming the logic array is particularly simple for the user when the total functional performance characteristics are specified in a programming language for storage-programmable control systems, especially in a graphic programming language.

Further advantages and details of the present invention are revealed in the following description of an exemplified embodiment, based on the drawings.

BRIEF DESCRIPTION OF THE DRAWINGS

FIG. 12 depicts schematically depicts the communication between the logic module and the processor.

DETAILED DESCRIPTION

Figure 1:
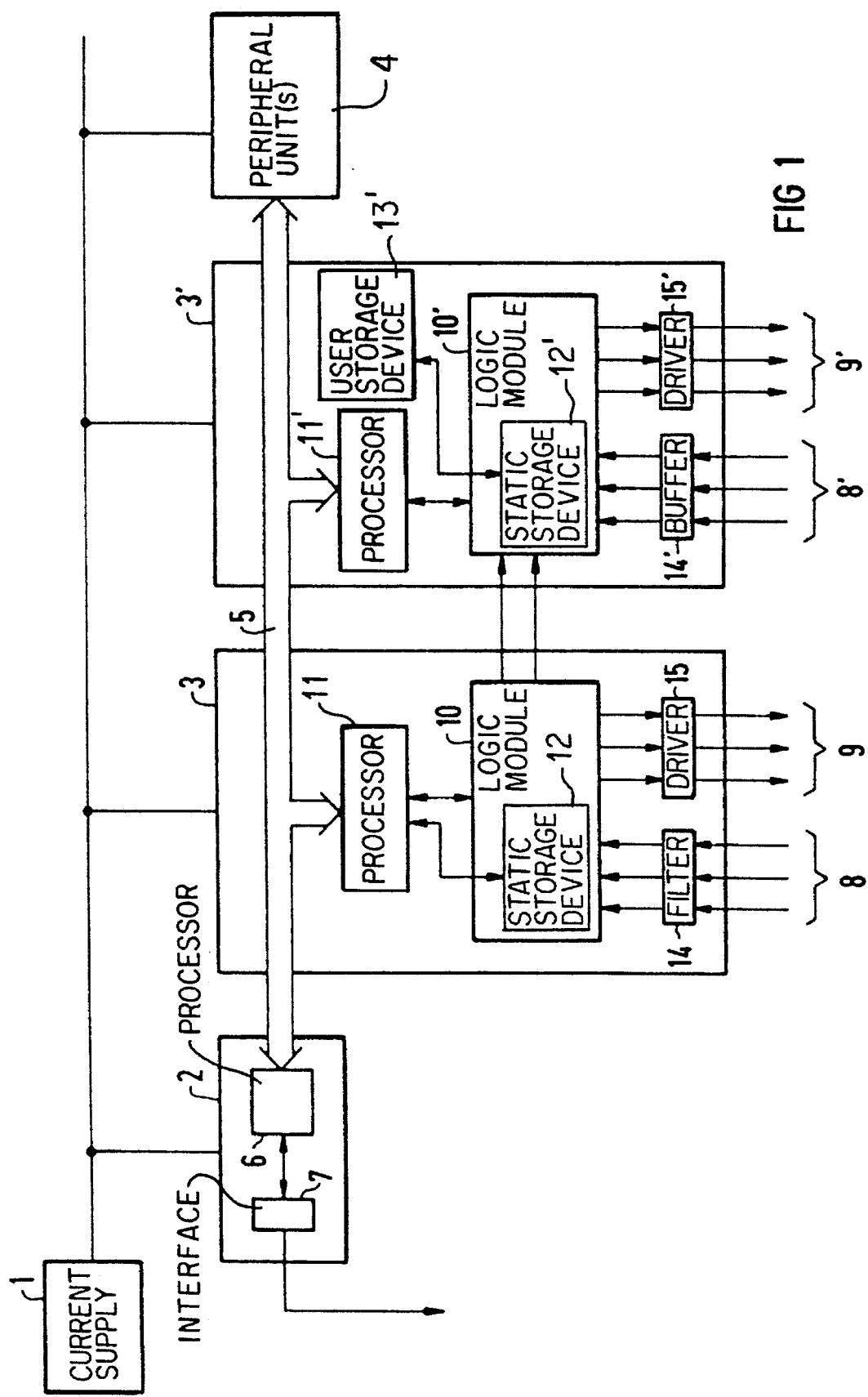
FIG 1 depicts several subassemblies of a modular storage-programmable control system.

According to FIG. 1, a modular storage-programmable control system comprises a current supply 1, a central processing unit 2, the input/output subassemblies 3, 3', as well as additional peripheral units 4. The subassemblies 2, 3, 3', 4 are interconnected via a bus 5. The central processing unit 2 has at least one processor 6 for executing a program, as well as an interface 7 for exchanging data with a programming unit.

Also apparent from FIG. 1, the subassembly 3 has a logic module 10, which can be a field-programmable gate array (FPGA), for example. The logic module 10 is connected via processor 11 to the bus 5 and, consequently, to the central processing unit 2. In this manner, programming the internal interconnections of the logic module 10 from a programming unit via the central processing unit 2 such that the inputs 8 are connected via the logic module 10 to the outputs 9, under logic conditions between input and output signals previously derived from the program to be executed is possible. To this end, the user sets up two program parts using the above-mentioned programming unit: a non-time critical part; and a time-critical part. Both parts are transferred by the programming unit to the processor 6 of the central processing unit 2. The non-time critical part is stored in the central processing unit 2, as is customary for storage-programmable control systems, and is executed sequentially. The time-critical part is transferred further by the processor 6 to the logic modules 10, 10', and is converted by these modules into a logical interconnection.

The two program parts operate independent of one another. However, by using special commands, the processor 6 and the logic modules 10, 10' can exchange information.

The logical conditions, which establish the interconnection of the logic module 10, are advantageously transferred to a static storage device 12 of the logic module 10, such that the interconnection of the logic module 10 is determined based on the contents of the storage device 12.

The subassembly 3' likewise has a logic module 10' with a static storage device 12'. However, the logic module 10' is programmed via a user storage module 13'. When the interconnection of the logic module 10' is to be altered, the user storage module 13' must be replaced or reprogrammed since the logical conditions which determine the interconnection of the logic module 10' are stored in the user storage module 13'.

Figure 2:
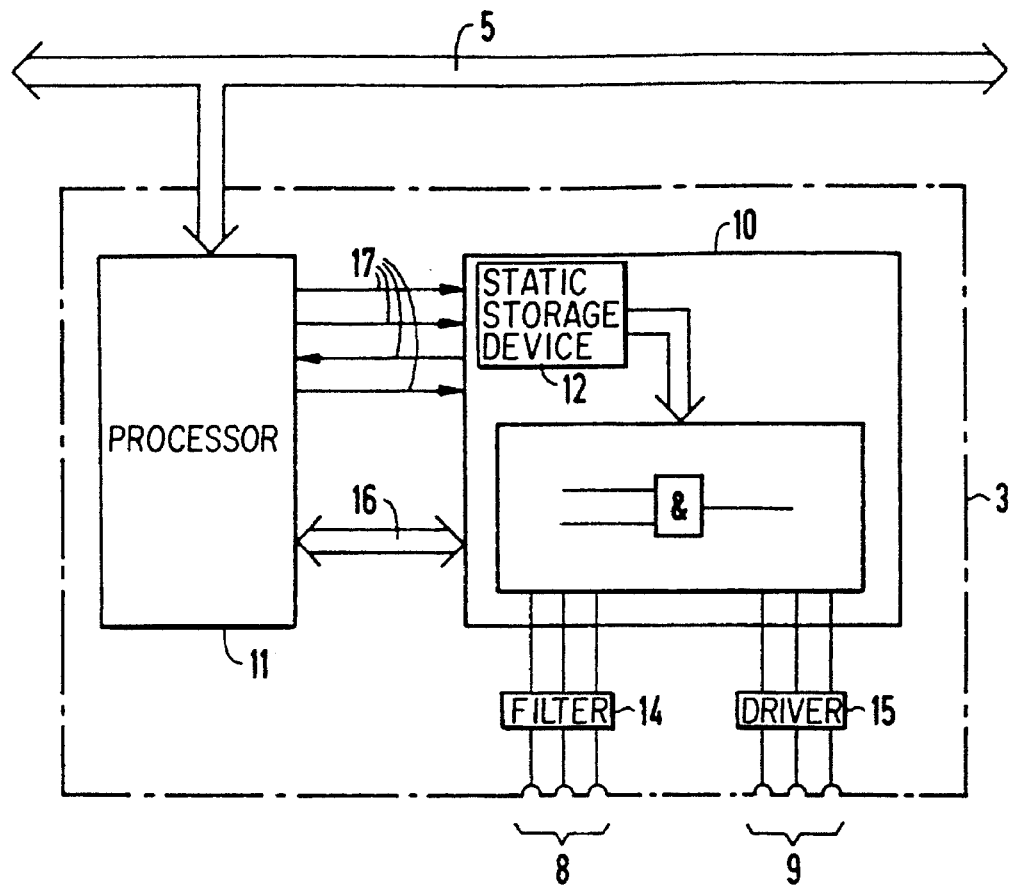
FIG. 2 depicts the internal structure of an input/output subassembly.

In a somewhat modified depiction, FIG. 2 shows the electrical design of the subassembly 3. As is apparent from FIG. 2, the inputs 8 are connected via input filters 14 to the logic module 10, and the outputs 9 are connected from the logic module 10 via output drivers 15 thereby ensuring that the logic module 10 is not damaged by an unintentionally defective circuit wiring, a short circuit, or similar malfunctions. Furthermore, the input signals can be debounced by the input filters 14. Also, signal levels can be adapted to by the filters 14 and the drivers 15, for example from 20 mA to 5 V.

The logic module 10 is connected, via bus 16 and control lines 17, to the processor 11, and thus also to the processor 6. Therefore, monitoring the correct function of the logic module 10 is possible, even during operation. To monitor the logic module 10, the values of corresponding inputs 8 and outputs 9 can be transmitted simultaneously to the processor 11 and, in addition, to the processor 6 for processing in the logic module 10. If applicable, intermediate states of the logic module 10, for example a flag or a counter content, can be signalled to the processor 6. New control parameters, for example new time constants, can also be transferred to the logic module 10.

The control lines 17 depicted in FIG. 2 are used, for example, to transmit a reset signal, with which the internal flags can be reset, and to allow the logic module 10 to provide the processor 6 with its present programming state, for example, "programming logic module altered". The programming of the logic module 10 can only be altered when the logic module 10 is inactive, i.e., when the logic module 10 is not linked to the control of a process. When the logic module 10 comprises several independent operative parts, deactivating only one part, to alter that part's programming, is possible.

Figure 3:
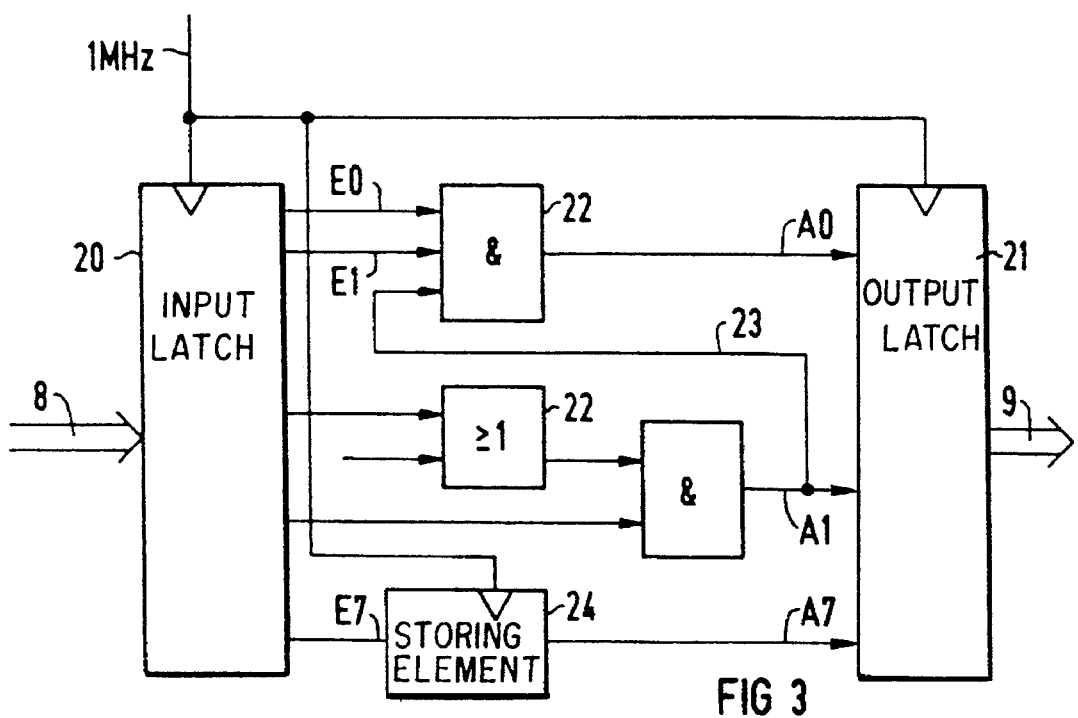
FIG. 3 depicts the connections between inputs and outputs.

According to FIG. 3, the logic module 10 has an input latch 20 and an output latch 21, clocked, for example, with a clock pulse of 1 MHz. The inputs 8 provide the inputs of the input latch 20. The outputs of the output latch 21 provide the outputs 9. The actual, parallel processing of the signals takes place between the latches 20, 21. To this end, an elementary logical gating of the inputs E0 and E1 is carried out, for example, in the logic switch 22, possibly also including interim results, as is indicated through the line 23.

The result of the logic switch 22 can be further processed or directly supplied to one of the output latch's input pins. In the present example, the result of the logic switch 22 is provided to the output A0. As mentioned above, the logic switches 22 can carry out any elementary, logical gatings, for example, EQV, AND, OR, NAND, NOR. To realize more complex functions, the logic module 10 advantageously has storing elements 24, from which counters, timing devices or edge trigger flags, for example, can then be set up.

Figure 4:
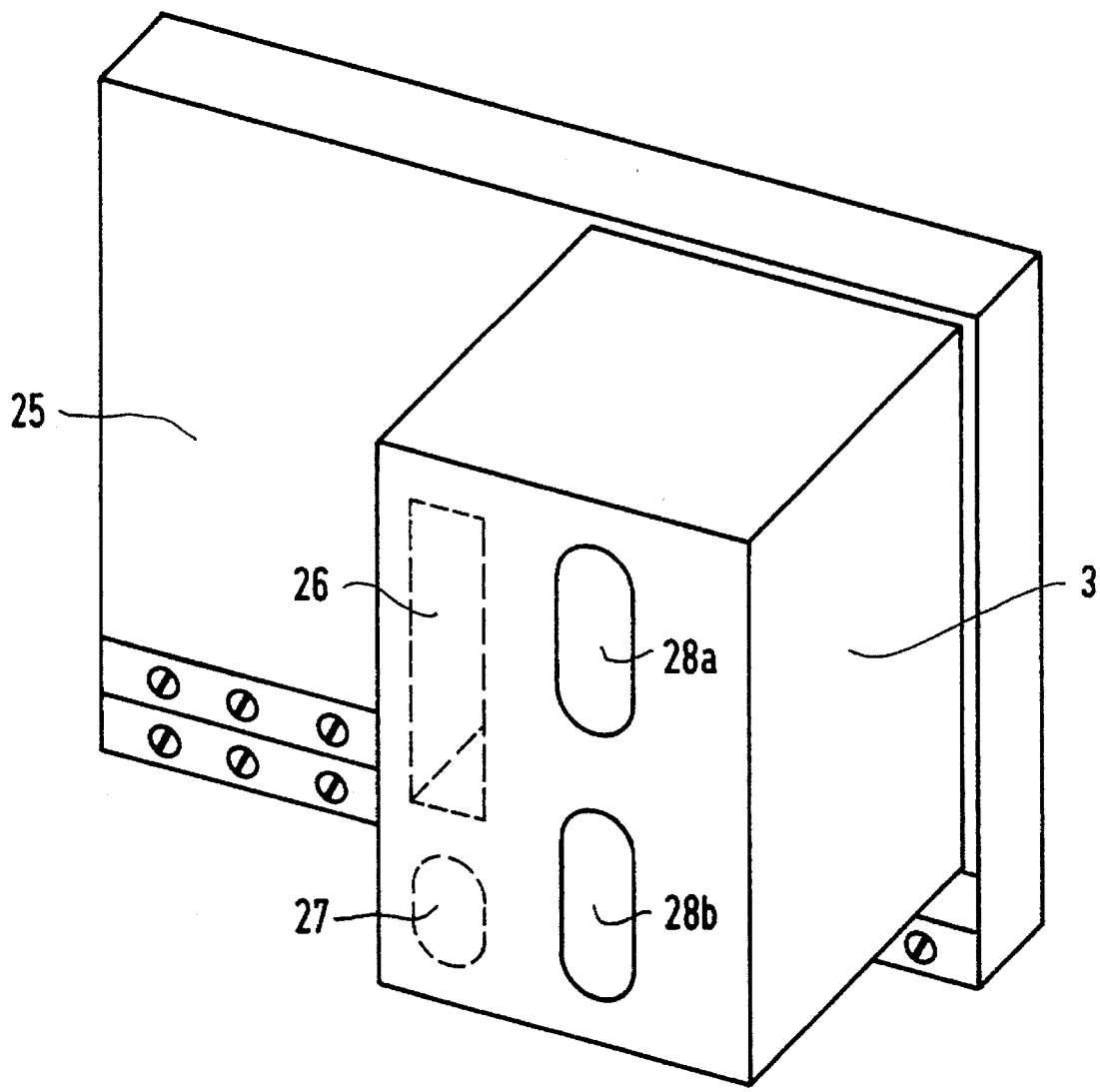
FIG. 4 depicts the structural design of an input/output subassembly.

FIG. 4 depicts a preferred structural design of the input/output subassembly 3. As shown in FIG. 4, the subassembly 3 is preferably an encapsulated, pluggable, printed-board assembly, connected to a modular mounting rack 25. The subassembly 3 has a module slot 26 to accommodate, for example, the user module 13' depicted in FIG. 1 and has an interface 27 for linking a programming unit. Programming the logic module 10 contained in the subassembly 3 directly (i.e., not via the processor 6) is possible via the user module 13' and the interface 27.

Furthermore, the subassembly 3 includes two sub-D plug-in contacts 28a and 28b, whereby the contacts 28a are used for connecting sensors and the contacts 28b are used for connecting final controlling elements.

The present invention maps a conventional, sequential, user program for a storage-programmable control system, to the extent possible, onto the structures known from contactor relaying (i.e., to directly wire up the corresponding inputs and outputs via logic elements). To this end, the logical conditions of a user program produced in a programming language for storage-programmable control systems are converted into a connection list and filed in a data field. These data are then loaded into the logic module 10 and provide the data necessary for a corresponding internal interconnection of the logic module 10. As shown in FIG. 1, interconnecting several of these logic modules 10, 10' serially and/or in parallel to one another is possible such that the program to be run is divided between the central processing unit 2 and the subassemblies 3,3'.

By directly wiring corresponding inputs and outputs to one another, the process map required for conventional storage-programmable control systems is eliminated. In addition, the storage-programmable control system is extremely fast (the "cycle time" tends to approach zero). Also, performing the alarm response becomes reproducible, since the alarm response time is better observed.

In the exemplified embodiment described above, the logic module was used in a modular programmable controller. This application of the logic module is also possible in a programmable controller capable of stand-alone operation. In the most basic version of this programmable controller, the programmable controller no longer has a processor, but still has the logic module, so that the program to be executed is carried out solely by the logic module. In such a version, programming the logic module takes place either via an interface to a programming unit or via a storage module previously programmed by the user.

Figure 5:
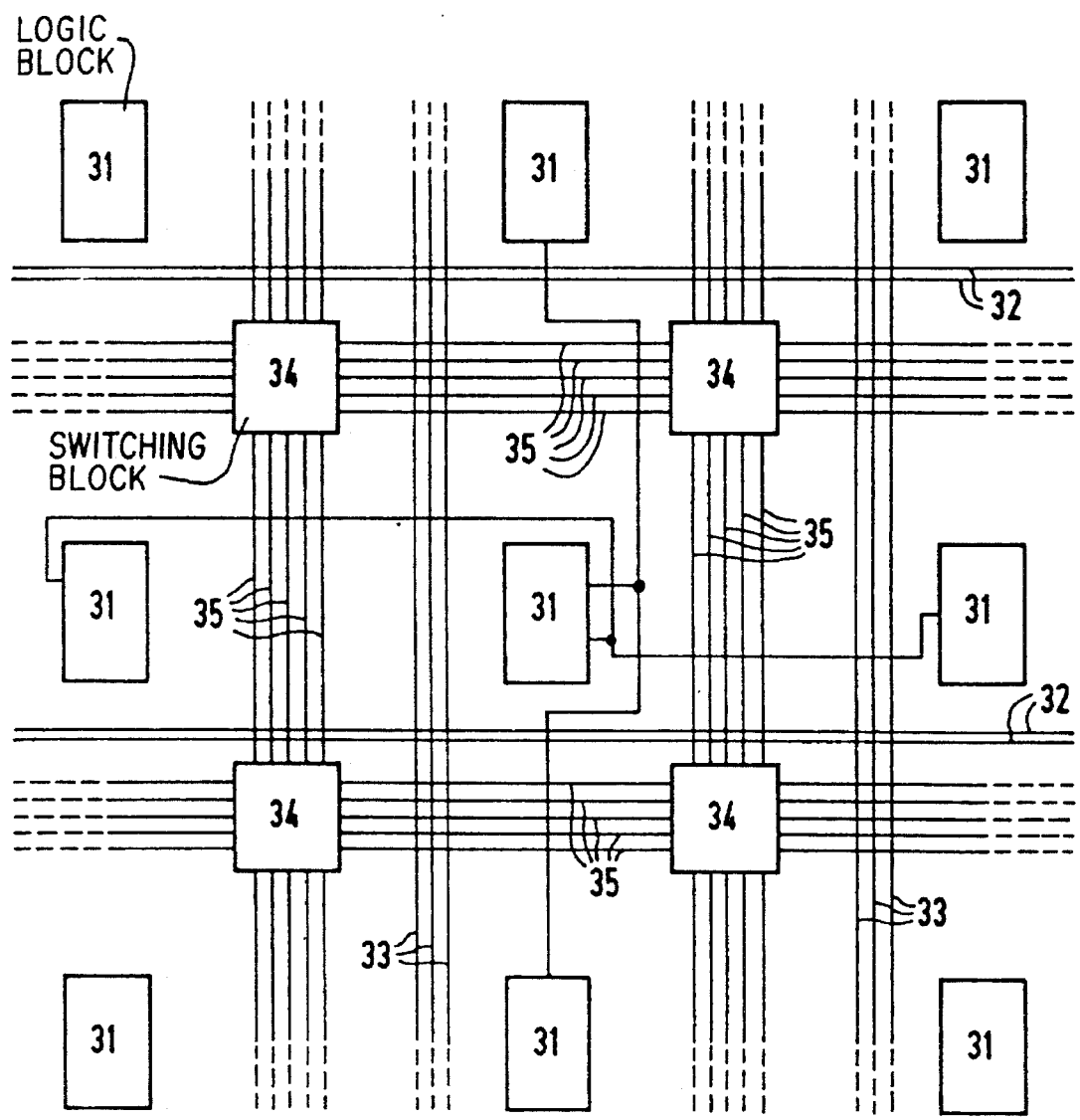
FIG. 5 depicts the inner structure of a field-programmable gate array.

Here, the logic modules 10, 10' are field-programmable gate arrays (FPGAs). FIG. 5 depicts a portion of the inner structure of such a logic arrays. The inner structure shows a two-dimensional matrix of, for example, 12×12 logic blocks 31. This matrix is surrounded by a ring of input/output blocks. Two input/output blocks are assigned to both the beginning as well as the end of each row and each column. The input/output blocks are not depicted for clarity. In addition, two non-interruptible connections 32 are assigned to each row of logic blocks 31; and three connections 33, two of which can be interrupted once in the middle of each column are assigned to each column. This configuration of logic blocks 31 and input/output blocks is penetrated by a network with 13×13 switching matrices 34, whereby adjacent switching matrices 34 are each interconnected via five short connections 35.

Figure 6:
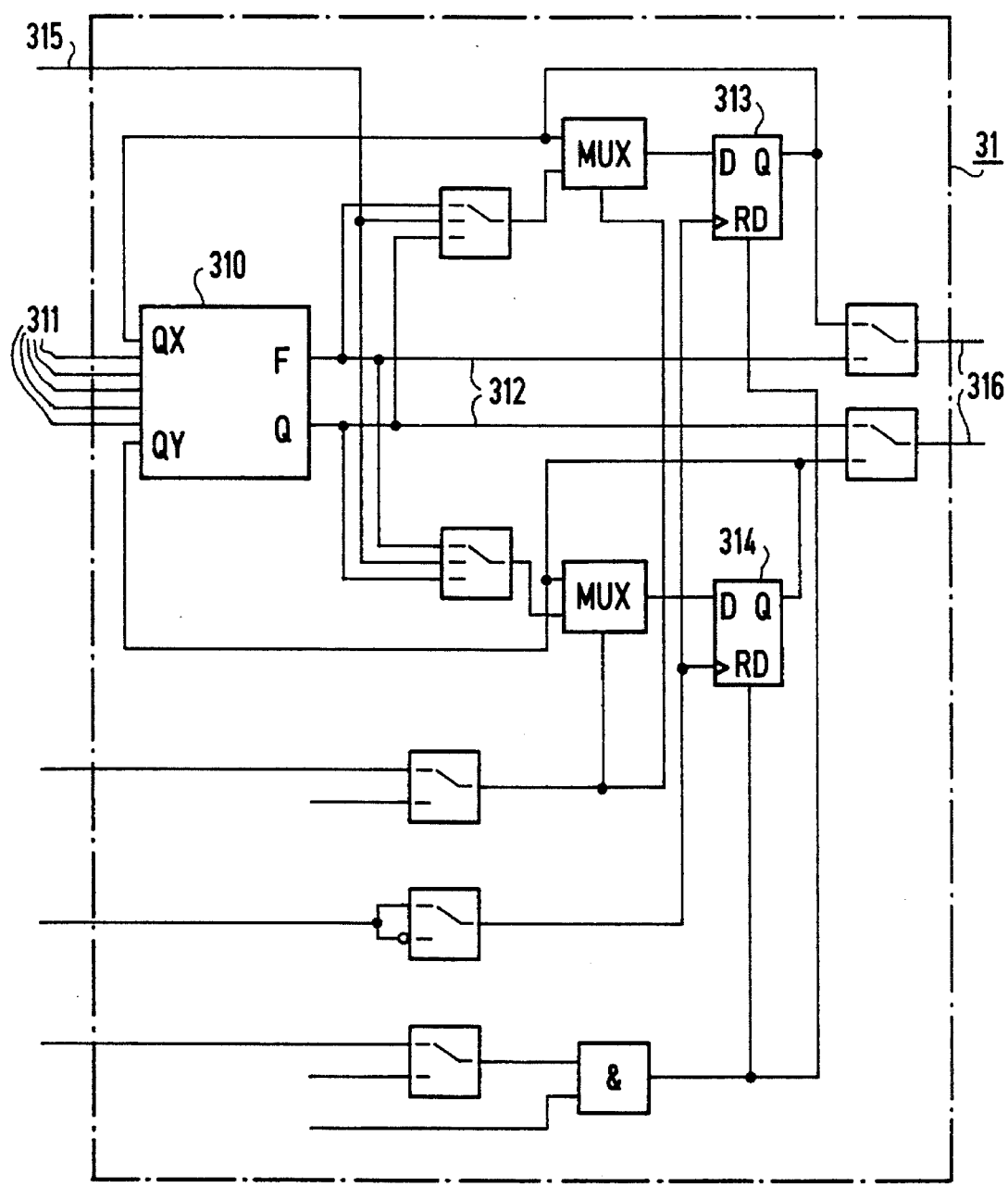
FIG. 6 depicts the design of a logic block.

According to FIG. 6, the logic blocks 31 each comprise a combination block 310, which determines two output variables 312 from a maximum of five input variables 311.

Further, the logic block 31 has two flipflops 313, 314, having input signals consisting either of one of the output variables 312 of the combination block 310 or of a variable input directly through the input 315. The output signals from the flipflops 313, 314 can either be fed back into the combination block 310 or be output as one of the output signals 316 from the logic block 31. Thus, programming the logic block 31 can be directed towards those logic and/or storage functions to be carried out.

In principle, the two output functions of the logic block 31 are independent of one another. However, here they are always selected to be the same, since each of the two outputs 316 can be directly connected to two of the four closest neighbors of its logic module. Because the two functions are identical, the output signal of each logic block 31 can be made available as an input signal to its four closest neighbors (see FIG. 5). Therefore, a more structured topology results.

Further, the outputs 316 can be connected to the short connections 35 surrounding them, as well as to the long connections 32, 33 surrounding them. In addition, electrical connections still can be programmed among the points of intersection between the long connections 32, 33, as well as between the long connections 32, 33 and the short connections 35.

The switching matrices 34 are likewise programmable. They can realize a multitude of the theoretically conceivable interconnections, for example, horizontal and/or perpendicular through-connections, the contacting of horizontal with perpendicular short connections 35, and dividing up one connection into two or three.

The input/output blocks are connected to a chip connection pin and can optionally either input or output a signal, whereby this signal can be optionally clocked or not.

The programming for each logic block 31, each switching matrix 34, and each input/output block are each stored locally in these elements. To permit such local storage, each is provided with a small static storage device 12 (SRAM). Manufacturers' manuals, such as manuals covering the XC 3000 logic cell array family by Xilinx may be referred to, to provide any further details concerning field-programmable gate array modules.

To program these types of logic arrays, application specific integrated circuit (ASIC) design tools exist, with which the logic arrays are programmable in the circuit instructions adapted to the structure of the logic arrays. As far as these instructions are concerned, however, the ASIC-designer must observe many conditions specific to ASIC. Such conditions are, for example, propagation times, the signal level of unused gate inputs, etc. Obviously such programming approaches hardwiring and is highly complex and therefore can only be implemented by true experts.

Programs exist for converting the desired programming into internal interconnections of the logic module 10. The running time of these programs, that is, the time required to transform the desired total performance characteristics into an internal interconnection of the logic arrays, amounts to quite a few minutes, hours, sometimes even days. The long running time of these programs is particularly due to the diverse connecting possibilities.

The special knowledge mentioned above cannot be reasonably expected of the user of storage-programmable control systems. Users cannot tolerate the extremely long running times of the conversion programs. The user of storage programmable controllers expects running times within the range of seconds, at the most minutes. Therefore, based on an example, a method is described below which quickly and simply converts a programming language familiar to the user of storage programmable controllers into an internal connection of the logic arrays, this method meets the total performance characteristics required by the user of storage programmable controllers.

Figure 7:
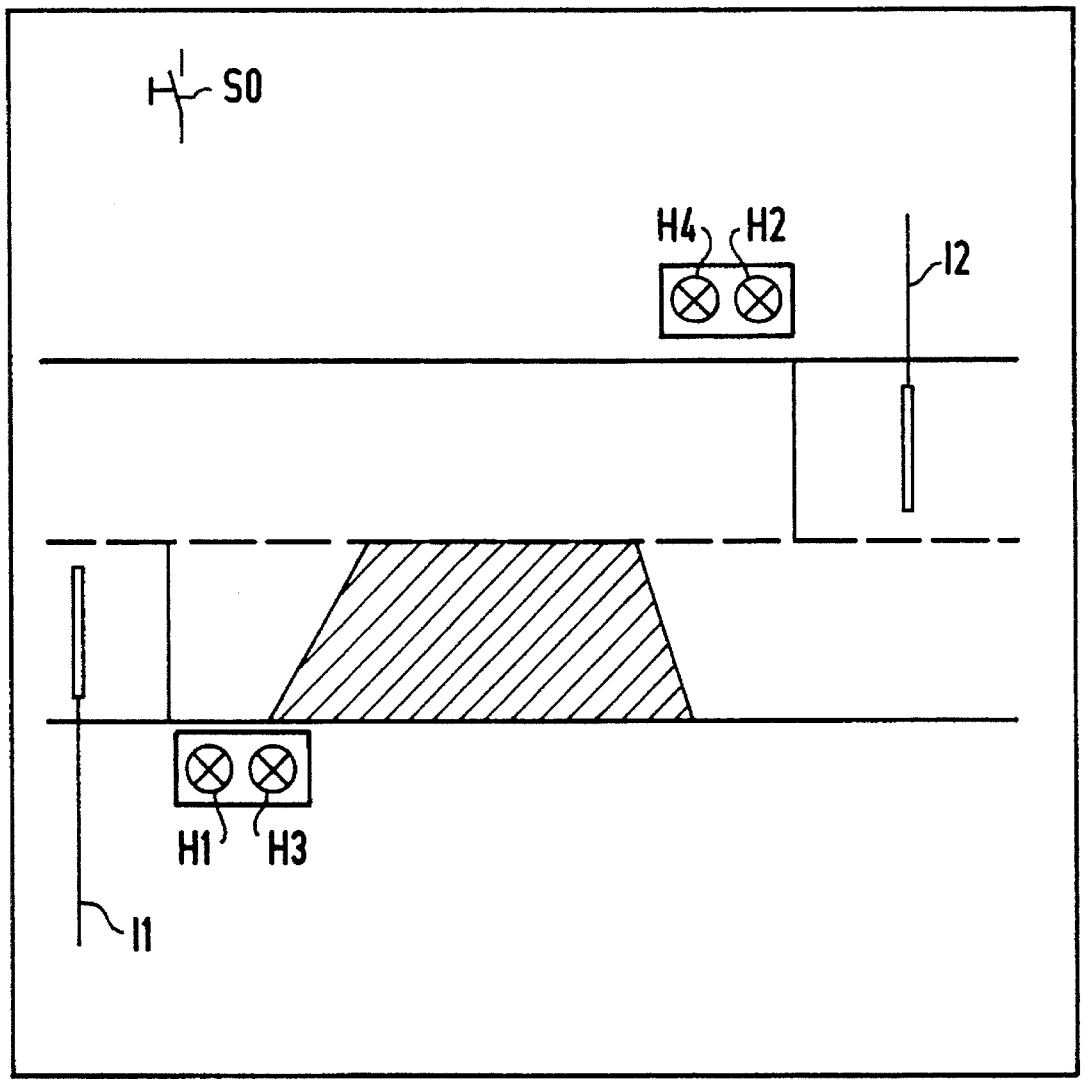
FIG. 7 depicts an example of solving a traffic-signal installation problem.

The example is drawn from the task collector, Simatic S5 of Siemens AG, order no. E 80850-C 345-X-A1, and is clarified referring to FIG. 7. In this example, the traffic on a street must be directed over a traffic lane due to construction work. If traffic volume is very high, an optional traffic-signal installation is installed. When the installation is switched on, both traffic lights show red. If an initiator is actuated, then a corresponding light switches after 10 seconds to green. The green phase is supposed to last for at least 20 seconds, until both signal lamps show red again as the result of possible actuation of the other initiator. After 10 seconds, the other traffic lane is switched to green. If there is no status signal from an initiator, then the traffic-signal installation remains in its current state. The installation is only supposed to be able to be switched off after the green phase of a traffic lane. When the control system is switched on, the initial state (M0) must be unconditionally set.

To transform the problem into an programming language for storage programmable controllers, the symbols are first renamed as indicated in the Table below.

| Symbol | Operand | Comment |
| --- | --- | --- |
| S0 | E0 | Switch on (make contact element) |
| I1 | E1 | Initiator 1 (make contact element) |
| I2 | E2 | Initiator 2 (make contact element) |
| H1 | A1 | Green |
| H2 | A2 | Green |
| H3 | A3 | Red |
| H4 | A4 | Red |
| M0 | M0 | Initial state M0 |
| M1 | M1 | State 1 |
| M2 | M2 | State 2 |
| M3 | M3 | State 3 |
| M4 | M4 | State 4 |
| M5 | M5 | State 5 |
| M6 | M6 | State 6 |
| M7 | M7 | State 7 |
|  | T1 | Time 10 seconds |
|  | T2 | Time 20 seconds |
|  | KT 100.1 | Time for counter 1 |
|  | KT 200.1 | Time for counter 2 |

Figure 8A:
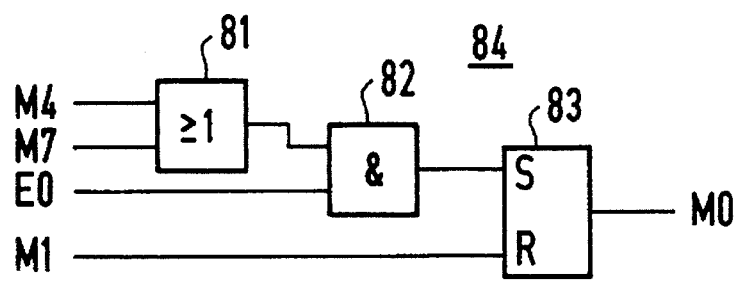
FIGS. 8a–8n depicts the corresponding solution realized by circuit engineering of the traffic-signal-installation control.
Figure 8B:
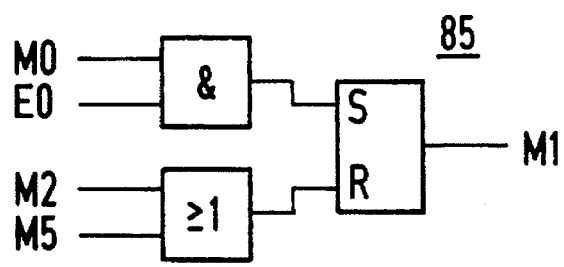
Figure 8C:
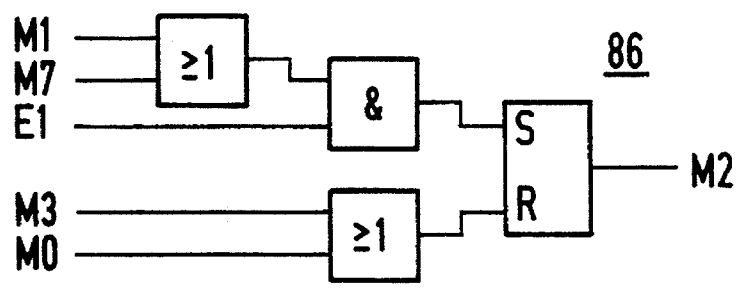
Figure 8D:
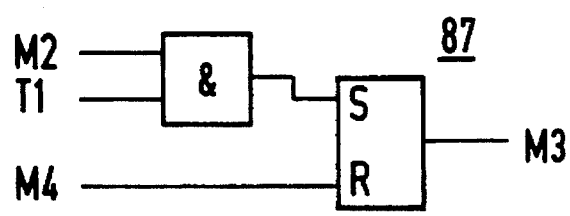
Figure 8E:
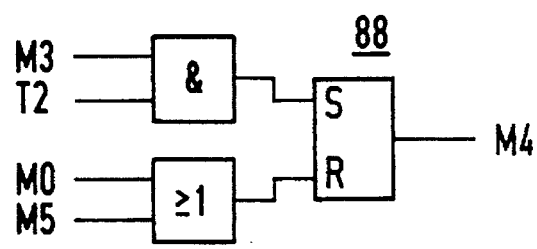
Figure 8F:
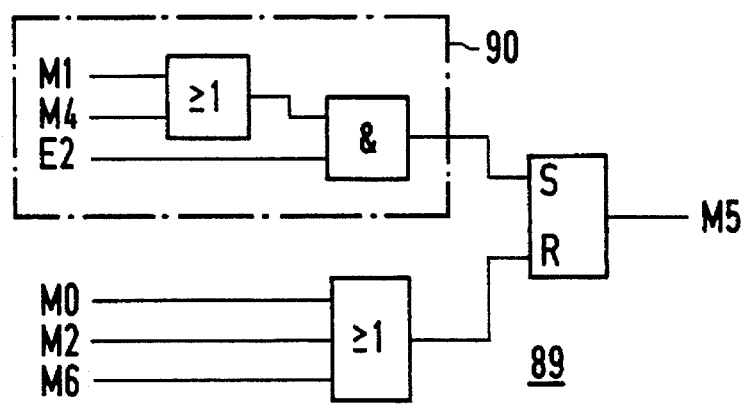
Figure 8G:
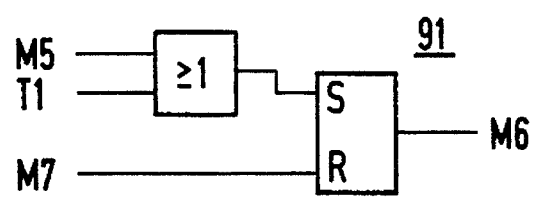
Figure 8H:
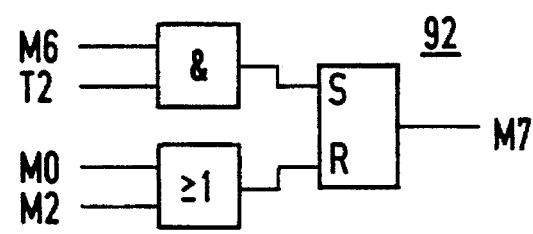
Figure 8I:
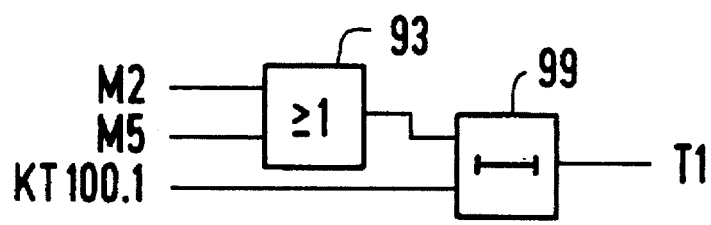
Figure 8J:
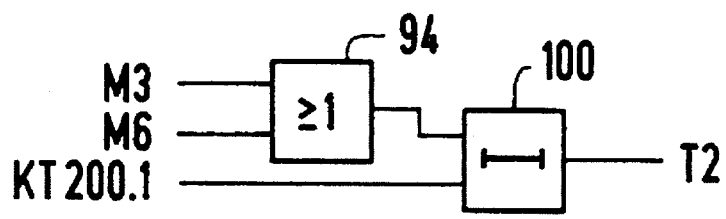
Figure 8K:
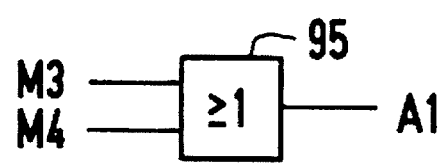
Figure 8L:
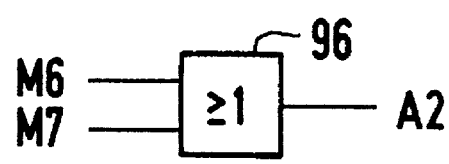
Figure 8M:
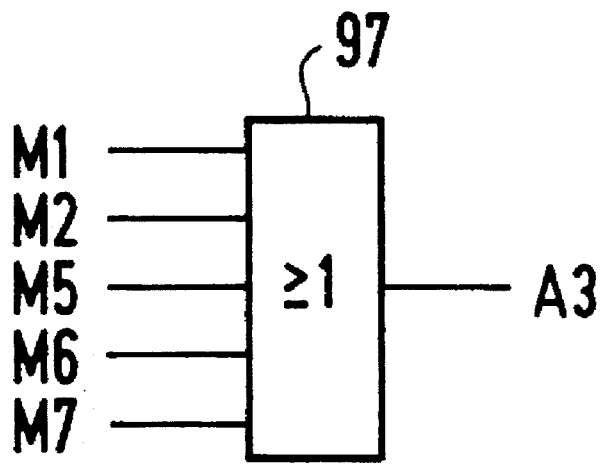
Figure 8N:
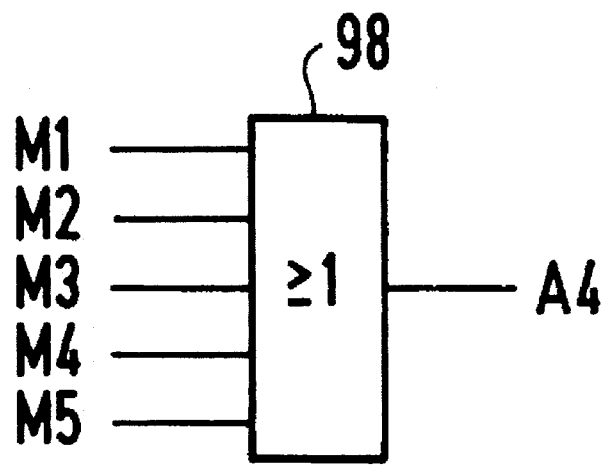

The corresponding interconnection is represented in the programming language for storage programmable controllers FUP (function diagram), as depicted in FIGS. 8a–8n. A typical user of storage programmable controllers is familiar with this type of programming. The present invention converts the specified total performance characteristics, formulated in a programming language for storage programmable controllers, quickly and simply into an FPGA structure, such that the user of storage programmable controllers can program the logic module 10.

To achieve this task, the program converted into the corresponding internal interconnection of the logic module 10 by the user program only takes advantage of a small fraction of the theoretically complex possibilities of the logic module 10 because a portion of the connections freely selectable in principle, for example the internal interconnection of the switching matrices 34, is firmly stipulated in the conversion program, and thus cannot be influenced by the programmer of the user program. The interconnections of the switching matrices 34 of each of the thirteen perpendicular columns are explicitly specified such that, first of all, the top-most, the bottom-most, as well as the middle three switching matrices 34 of one column connect through the horizontally running short connections 35 and, for the moment, do not yet connect the other short connections 35, and secondly, the remaining switching matrices 34 only connect through the perpendicular (i.e., vertical) short connections 35 and block the horizontal short connections 35.

Figure 9:
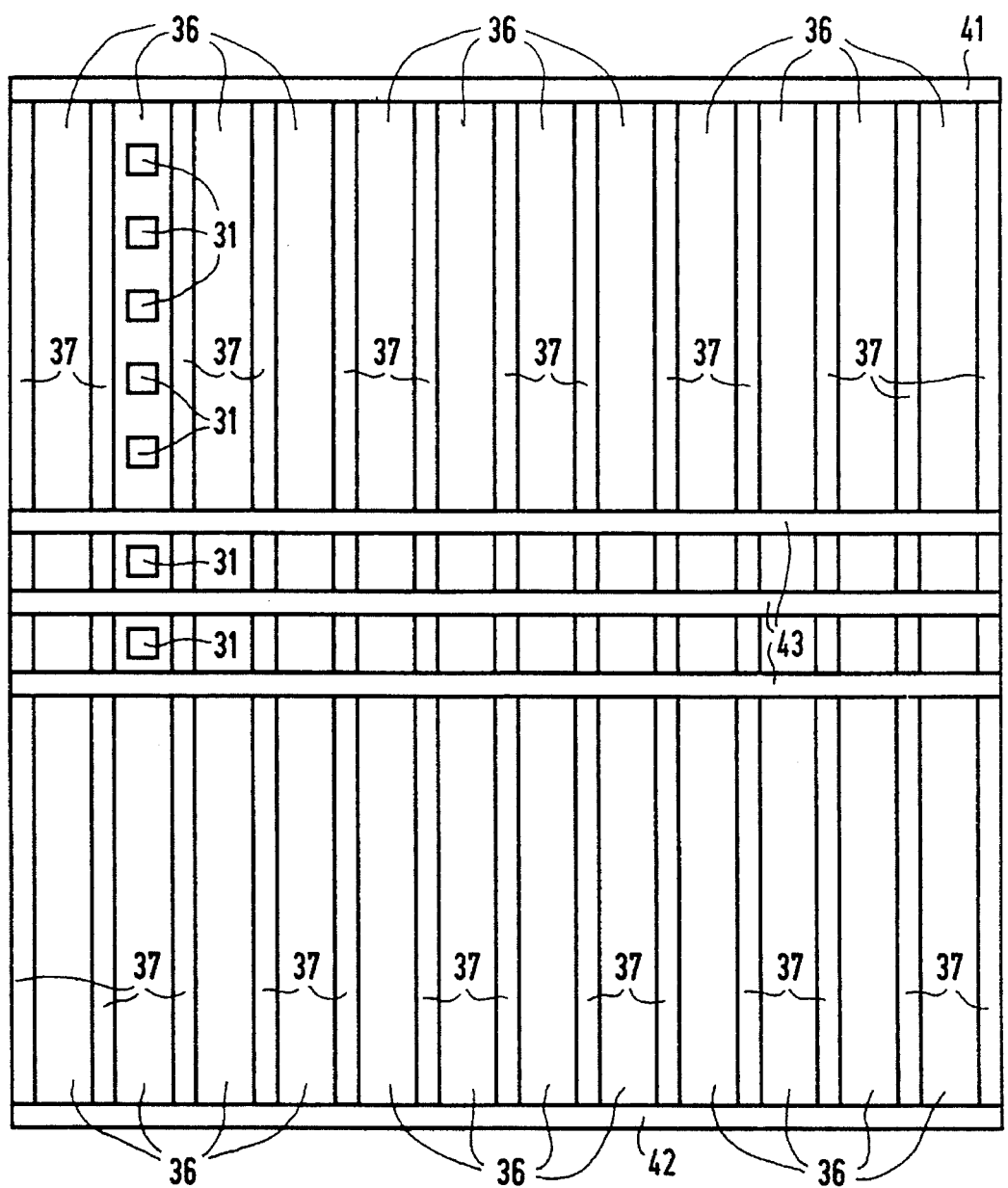
FIG. 9 depicts the preliminary establishment of the internal electrical connections.

In this manner, a structure as depicted in FIG. 9 is formed as follows: groups 36 are formed, each containing five logic blocks 31, arranged one below the other, and surrounded in the front and back by five short connections 37 which extend over the length of a "half column". The circuit arrangement of FIG. 8 is mapped onto these groups 36 in a manner described below. The two horizontal middle rows of logic blocks 31 are used to generate clock signals in a manner described below.

The groups 36 formed in this manner are of a manageable size. On the one hand, they are not so complex as to be incomprehensible so that estimating if a subnetwork of the total circuit arrangement to be realized can be achieved by one of the groups 36 is easy. On the other hand, the groups are large enough so that breaking up the entire circuit arrangement of FIG. 8 into subnetworks which are too small is not necessary. The available connection resources and the available logical capacity of the groups 36 are used as a criterion for selecting the subnetworks. Each subnetwork is designed such that:

a) it exhibits a maximum of five input signals;

b) it exhibits a maximum of five output signals;

c) a maximum of five of the logic blocks 31 are needed to realize the subnetwork; and d) the circuit wiring of the subnetwork is possible within the group 36.

Beginning with the OR-gate 81 in FIG. 8a, that the AND-gate 82 can be realized in the same logic block 31 is immediately recognizable, since combining these two functions also only results in a combination function with three inputs and one output. On the other hand, a separate logic block 31 is assigned to the RS-flipflop 83, since each of the logic blocks 31 can either only execute a combination function or only detect a storage function due to a compiler directive. Therefore, the subnetwork 84 (see FIG. 8a) can be realized in one group 36, since altogether only four input signals (of a maximum of 5); one output signal (of a maximum of 5) and two logic blocks 31 (of a maximum of 5) are needed.

Based on similar considerations, that the subnetworks 85 through 88 (see FIGS. 8b–8e) can also be realized in one group 36 each is apparent. However, the subnetwork 90 (see FIG. 8f) must be separated from the next network 89, otherwise the number of inputs would exceed the maximum permissible value of five.

The other networks 91 through 100 (see FIGS. 8g–8n) of the entire circuit arrangement are divided up analogously, but are not yet assigned to specific groups 36.

The timing elements 99 and 100 cause a certain difficulty when the individual networks are divided up, since no corresponding counterpart in the "world of field programmable gate arrays" corresponds to a timing element in the "world of storage programmable controllers". Nevertheless, to allow the user of storage programmable controllers to easily program timing elements, this function, often required for storage-programmable control systems, is made available to the user as a function macro.

In the compiler running time, the compiler recognizes that a function macro exists and converts this macro into an internal standard connection movable within the logic arrays. The internal standard connection was first determined thereby by the compiler manufacturer or rather by the ASIC designer. In this manner, the compiler is not burdened with determining the connections which realize the function macro.

Figure 10:
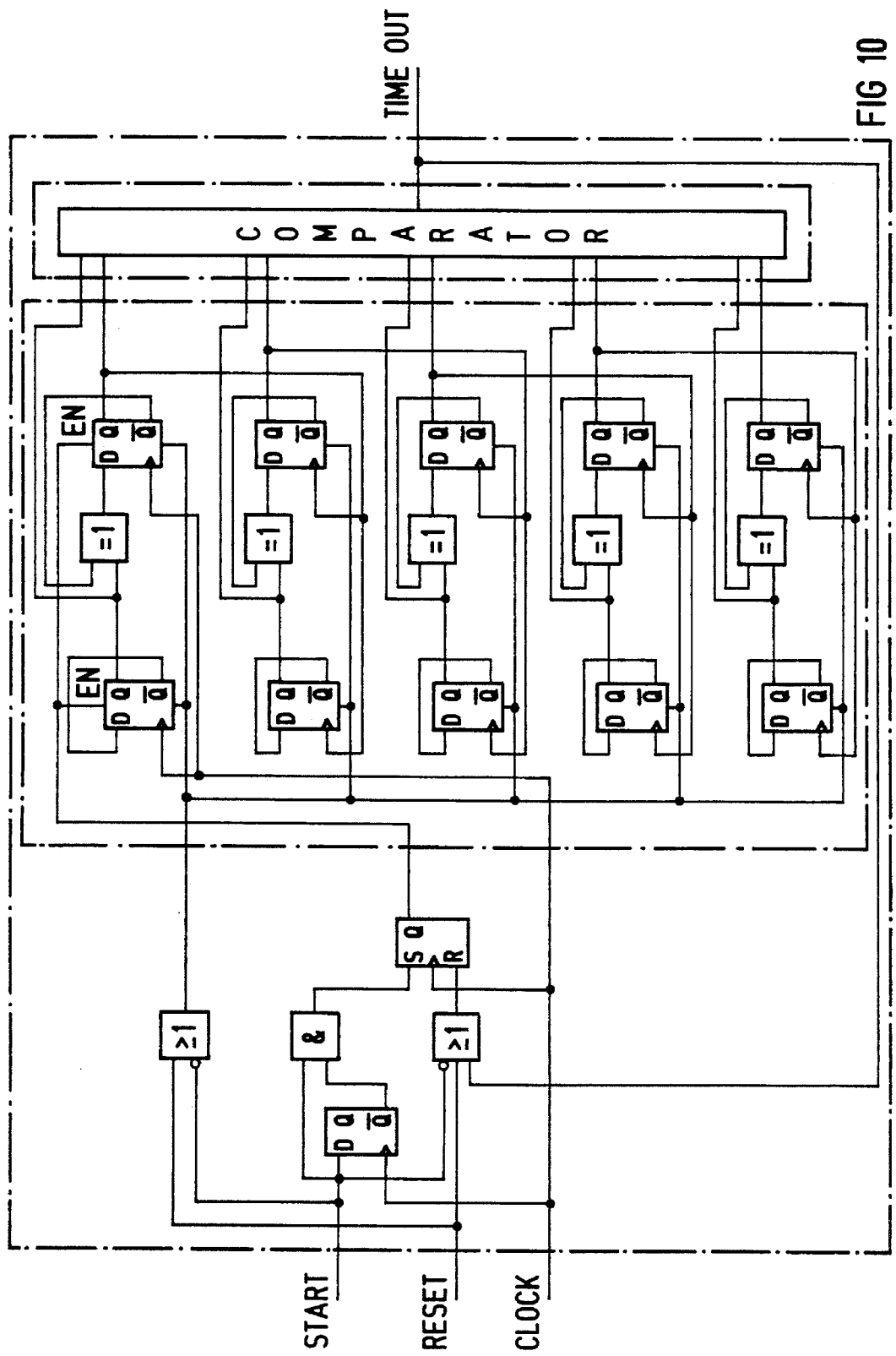
FIG. 10 depicts an example of an internal electrical standard connection.

FIG. 10 shows an example of such a standard connection for a timer, which can count up to $2^{10}$ cycle times. The actual countable time, of course, still depends on the clocking of the counting unit.

The example shown in FIG. 10 requires three side-by-side groups 36 of logic blocks 31. Here, the exact mapping of the logic on FPGA structures depicted in FIG. 10 is irrelevant for the user of storage programmable controllers. When these types of hard macros are created with standard ASIC design tools, the compiler manufacturer, or rather the ASIC designer, must be careful that only local connections, in other words direct connections and short connections 35, are used rather than global long connections 32, 33. This enables these macros to not only be easily moved (thus relocated) and also to be placed independently of the networks or macros surrounding them.

Since hard macros are made available to the programmer (or user) of storage programmable controllers through a library (i.e., the macros were created in advance), the internal configuration of such a macro is also not bound to the limited possibilities of the user programming. Rather, the full complexity of the occupied arrays area can be utilized. The restrictions of the user programming can be dropped.

Creating such hard macros by the compiler manufacturer or the ASIC designer, and also running the conversion programs can, in fact, take hours or even days. However, the long period for creating these hard macros can be tolerated. On the one hand, namely, only 3×5=15 of the logic blocks 31 instead of 12×12=144 of the logic blocks 31 are to be connected to one another. On the other hand, as already mentioned, the macros are created in advance. Therefore, creating these macros does not burden the user, rather they are immediately available to the user (i.e., assigning the hard macro to a specific location in the FPGA takes only fractions of seconds). The ease of accessibility of the four inputs or outputs—"start", "reset", "clock", and "time lapse" is all the designer must consider. If desired, having larger or smaller versions of these macros for other possible standard functions of the "world of storage programmable controllers" is, of course, possible.

After the-entire circuit arrangement is broken down into subnetworks 84 through 98, these subnetworks are combined, in so far as the combination also fulfills the above described criteria a) through d). For example, the subnetworks 87 (see FIG. 8d) and 94 (see FIG. 8j), as well as the subnetworks 93 (see FIG. 8i) and 97 (see FIG. 8m) are combinable. This combination is not absolutely necessary, but does increase the utilization factor of the logic arrays.

When, contrary to expectations, the number of five inputs or five outputs must be exceeded in the individual case to realize the desired interconnection, this can be achieved—according to need—by leaving open one or more groups 36 in front of the group 36, which require more than five input signals, and by feeding these signals by way of exception via the horizontal short connections and/or via direct connections from the logic blocks 31 of the group 36, lying in front, of the group 36, which requires more than five inputs. If these additional connection possibilities also do not suffice, an error message, "desired circuit arrangement cannot be produced, insufficient connection possibilities" is generated.

Figure 11:
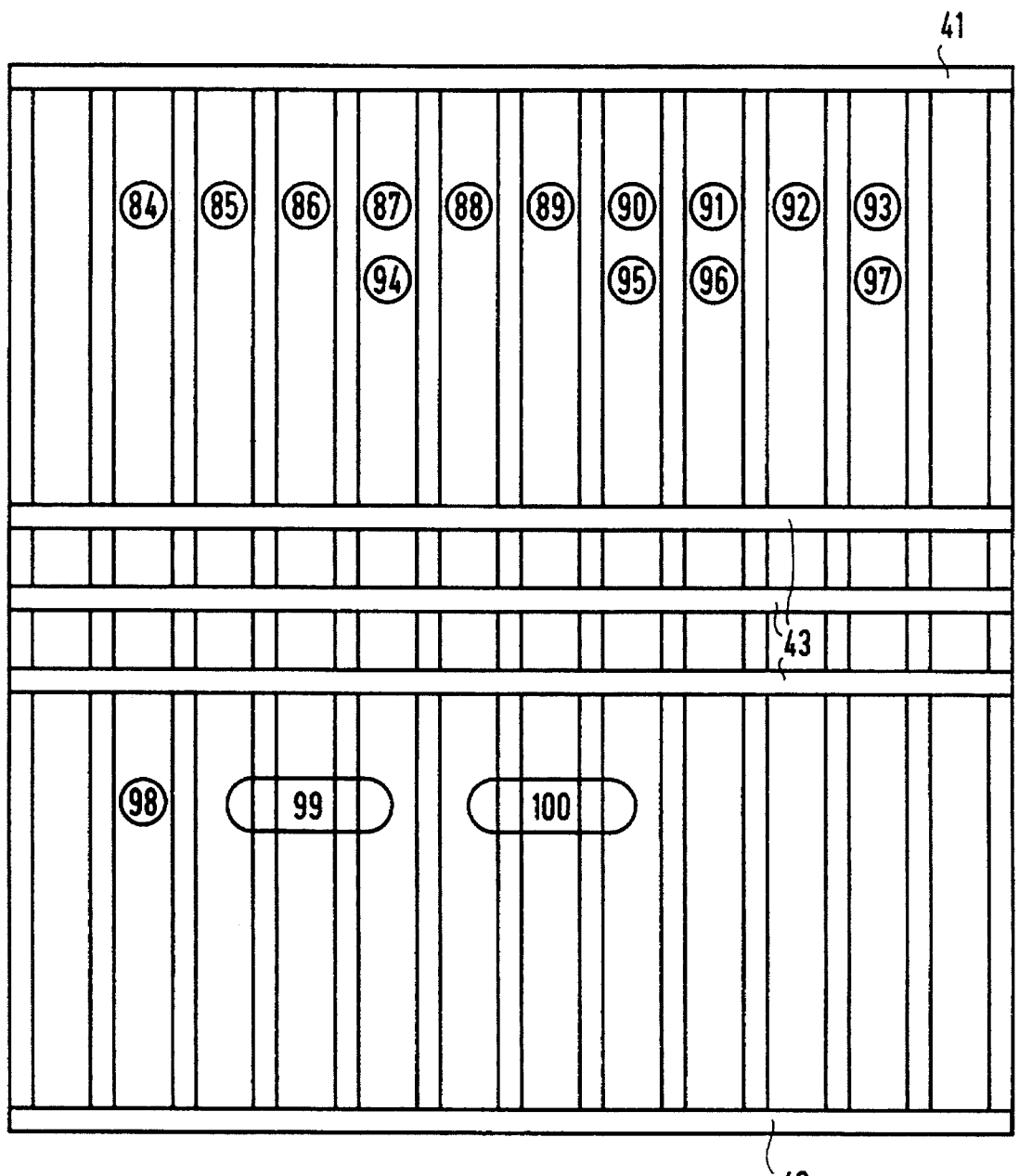
FIG. 11 depicts the specified total performance characteristics realized in the field-programmable gate array.

The individual subnetworks 84 through 100 are assigned now to the individual groups 36, as depicted in FIG. 11. The subnetworks 84 through 100 are allocated to the individual groups 36 by their sequence. This is the simplest way to allocate the subnetworks. More complex solutions which already consider the connections of the subnetworks 84 through 100 among themselves are also conceivable. The outermost groups 36 are not occupied, since the external, lengthened, short connections 37 are not available to tie up these groups, but are needed elsewhere. This use for a different purpose shall be described below.

An example of a more complex solution in allocating the subnetworks 84 through 100 to the individual groups 36 would consist, for example, in configuring the network 98 in the outermost right group 36. The sole output, of this network is the process output A4. This process output could, however, directly be connected to an input/output block. Thus, neither lengthened short connections 37 nor other global connection resources would be needed.

After the subnetworks 84 through 100 are assigned to the groups 36, the internal electrical connections are established. Here, to the extent possible, the direct connections between the logic blocks 31 are utilized initially. In the present example of the signal-light circuit arrangement, only a few direct connections exist. For the most part, only the flag output of the subnetworks 84 through 91 can be put through further into the next network in each case. However, in the present case, even this is not useful, since the output signals from the individual subnetworks are also needed elsewhere and, therefore, more global connections must be used.

First, the input and output signals to and from the process to be controlled are put through, thus the input signals E0 through E2 and the output signals A1 through A4. To the extent possible, the input and output signals are fed directly via the horizontal long connections 32 to the outermost of the lengthened short connections 37. If the horizontal long connections 32 are already occupied, for example because three signals have to be put through, but only two horizontal long connections 32 are available, the signals are initially applied to perpendicular long connections 33 or to the perpendicular short connections 37. They are then fed via a long connection 32, which is assigned to another row of logic blocks 31, to the edge of the logic arrays. At the edges of the logic arrays, the input and output signals are put through further by the lengthened short connections 37 such that, for example, the logical input signal E0 is put through to the physical process input E0.

Simply by counting the remaining internal inputs or outputs of the individual networks 84 through 100, the five lengthened short connections 37 between the subnetworks 84 through 100 always suffice to network the inputs and outputs of the subnetworks 84 through 100 perpendicularly to one another. Should more than five lines be required, the perpendicular long connections 33 would be used to effect a complete connection, preferably initially the interruptible long connections 33.

Simply by counting in this way, obviously only thirteen different signals must be fed within the logic field, namely the eight flag signals M0 through M7, the two timer signals T1 and T2, as well as 3 internal signals from the subnetwork 90 to the subnetwork 89, from the subnetwork 93 to the subnetwork 99, and from the subnetwork 94 to the subnetwork 100.

However, these internal connections are obviously easily possible. Namely, the internal output signals are applied simply one after another in the sequence of their formation to the two outer of the three middle short connection strips 43. Thus, ten internal signals can be tapped off within the entire logic arrays and are thus available everywhere as internal input signals.

The three internal output signals still to be put through are applied to three of the horizontal long connections 32, so that they are likewise able to be tapped off where they are needed. If one of these three signals is produced in the top row of the groups 36 as an output signal, but is needed in the bottom row of groups 36 the specific internal output signal is applied to one of the horizontal long connections 32 in the top half of the logic arrays. This horizontal long connection 32 is connected to a perpendicular long connection 33, and the perpendicular long connection 33 is connected to a horizontal long connection 32, arranged in the bottom half of the logic arrays so that this signal is also available in the bottom half of the logic arrays.

When an internal signal is generated in the bottom half of the logic arrays, but is needed in the top half as an input signal, the procedure is analogous. Moreover, when the networks 84 through 100 are arranged intelligently within the logic arrays, three of the internal signals can be put through directly, so that the two outer short connection strips 43 suffice for the still remaining ten internal signals.

The three internal signals mentioned above are produced only once as an output signal, namely in the subnetworks 90, 93 and 94, and are also needed only once as input signals, namely by the subnetworks 89, 99 and 100. Thus, when the subnetworks 90 and 89, 93 and 99, as well as 94 and 100 are allotted directly one behind the other, these signals can be connected among themselves directly via closest-neighbor connections of the logic blocks 31. A connection is also possible via the lengthened short connection 37 situated between the prevailing subnetwork pairs. In both cases, no horizontal connections 32, 41, 42, 43 are needed Consequently, these connections are available elsewhere.

For clocking the timers 99, 100, clock pulses of 1 ms, 10 ms, 100 ms and 1 second are made available within the logic arrays in the following manner:

Divider steps are set up by the compiler manufacturer using ASIC design tools. These steps divide any applied clock pulse down to 1/10, 1/100 and 1/1000 of its original frequency. This divider macro, is created thereby such that it only requires the two middle, previously unused rows of logic blocks 31, as well as the direct connections between these logic blocks. This portion of the system- programming of the FPGAs is fixed and does not change. A clock pulse of 1 ms is applied directly into this divider macro from outside of the logic module 10, via one of the input/output buffers.

The four FPGA-internal clock pulses of 1, 10, 100 and 1000 ms are allocated, for example, each to one of the four horizontal long connections 32, assigned to the two middle rows of logic blocks 31. These four time cycles consequently are available in the entire logic arrays and can be tapped off accordingly. Determining which of the clock pulses is put through to the timers 99, 100 follows, for the compiler, from designating the input variables KT x.y. According to the general regulation, x denotes the number of cycle times to be counted and y is a code for the unit of time. Thus, for example, 200.1 signifies that 200 cycles of the clock pulse are to be counted with the code 1, that is 100 ms. The timer thus measures 200×100 ms=20 sec. As a rule, for the control program to execute properly, the logic modules 10, 10' and the central processing unit 2 must also exchange data with one another during operation. For example, the parameterization of the logic module 10 may need to be changed during operation. Furthermore, the central processing unit 2 should be informed, at least from time to time, about the actual state of the logic module 10 (or 10'). However, the processor 6 and the logic modules 10, 10' are not synchronized with one another. Therefore, the problem of data consistency arises. As a result, the problem is further magnified because the processor 6 and the logic modules 10, 10' communicate data to each other serially. The serial data communication is necessary., otherwise too many of the pins of the logic modules 10, 10' would be needed to communicate with the processor 6.

The problem is solved by providing the user with other function macros. These function macros realize shift registers used for temporarily storing or buffering input or output data, and realizing working storages. The new data to be input are first written thereby by the processor 6 into the write buffer storage, for example of the logic module 10. During this time, the values stored in the buffer storages are indeed available in the logic module 10, but are not yet used since they have not yet been released. The new values written into the logic module 10 are then retrieved by the buffer storages into the working storages by a separate command. At the same time, the values read out of the logic module 10 are read into other, so-called read buffer storages. The data are then serially read out of these read buffer storages into the processor 6.

FIG. 12 shows an example of such a data cycle. In the present case, five lines are needed to transmit all the required signals. The following information is transmitted on those lines:

When the signal level of the line RW is zero, data can be written into the write buffer storage. When the signal level of the line RW is binary 1, data can be read out of the read buffer storages. All buffer storages are linked to the line RW such that they are triggered at the rising signal edge of the line RW. On one hand, the data are retrieved at the trigger instant from the write buffer storages into the working storages. On the other hand, data are retrieved from the logic blocks 31 into the read buffer storages provided.

The signals PA1 and PA2 are address signals. A maximum of three write buffer storages and read buffer storages can be addressed using the address signals PA1 and PA2. The theoretically possible fourth storage (2 signals= 22=4 addressing possibilities) must not be used. This level is applied to the logic module 10 when no data are read in or read out. Therefore, this address, for example the binary double zero (00), must not be used.

CLK is a clock pulse. When CLK is binary one (1), the buffer storage addressed at any one time reads a new bit in or out.

DATA is the data line, on which the information is transmitted. In the present example, nothing but binary ones (ls) are transmitted (purely coincidentally).

Thus, at least four lines, namely the lines RW, CLK, data, as well as at least one address line, are needed to read from or write to the buffer storages. These four signals are applied to the middle one of the three short, previously unused, connection strips 43 (see FIG. 9). As a result, these four signals are available across the entire logic module 10. When no parameters at all have to be read in or out, the middle one of the three short connection strips 43 is available for internally connecting the groups 36.

If more than three read buffer storages or write storage addresses need to be addressed, additional address signals PA3, PA4, etc. are applied to the logic module 10. These additional address signals are normally applied to two horizontal long connections 32 (see FIG. 5), whereby one of the long connections 32 is configured in the top half of the logic field, and the other in the bottom half of the logic arrays.

When additional storage macros are created, obviously logic arrays capacities are taken up. These logic arrays capacities are, of course, no longer available elsewhere.

Similar to the timers, the above-mentioned storage macros are, previously created by the compiler manufacturer using ASIC design tools. The compiler manufacturer knows, within the scope of his general expertise, how registers and shift registers should be set up. In the same way, the fact that shift registers should be controlled address lines so that only one is addressed at a time is generally known in the electronic field. Therefore, within the scope of the present invention, such storage configurations require no further clarification.

Thus, all the important steps entailed in quickly and simply converting a program of storage programmble controllers into an FPGA structure are now known. The internal electrical connections known at this point and the programming of the individual logic blocks 31, likewise determined at this point, are impressed in a generally known way on the logic arrays, causing it to effect the desired total performance characteristics, here, the control of signal lights. Further, the user receives a message about the utilization factor of the logic arrays or, when the realization is not possible, a message relating to this, as well as information about why the realization was not possible (e.g., because no more correction reserves were available).

The signal-light control selected in the present case as an exemplified embodiment is of course not as time-critical as other control operations. However, the signal-light control example was selected because the principle procedure was able to be easily explained on the basis of this simple example.

The result is therefore a field-programmable gate array, whose programming takes place quickly and simply and, above all, in a manner familiar to the user of storage programmable controllers.

What is claimed is:

1. A programming method for a field-programmable gate array, said field-programmable gate array having computer controllable internal electrical connections which can be programmed and reprogrammed by means of software, said internal electrical connections connecting logic blocks in an at least two-dimensional arrangement of logic blocks based on a user definable function, comprising the steps of:
    (a) determining internal electrical configurations, including said internal electrical connections and possibly logic functions of said programmable logic arrays based on specified functional performance characteristics; and
    (b) impressing the internal electrical configurations determined in step (a) upon said field programmable gate array,
    wherein the internal electrical configurations and internal electrical connections are freely configurably within the confines of a preset format, independent of the specified functional performance characteristics.

2. The method according to claim 1 wherein the logic blocks are organized into groups based on said preset format.

3. The method according to claim 2 wherein said specified functional performance characteristics are divided into subfunctions, said subfunctions being realizable in one of said groups of said logic blocks.

4. The method according to claim 2 wherein complex standard subfunctions have internal electrical standard configurations, said internal electrical standard configurations of said complex standard subfunction are predetermined.

5. The method according to claim 4 wherein said complex standard subfunctions are realized by more than one group of logic blocks.

6. The method according to claim 5 wherein said complex standard functions and said logic functions are combinable with each other and among themselves in accordance with said preset format.

7. A method for programming a storage-field programmable gate array control system to have specified functional performance characteristics, comprising steps of:
    determining internal electrical configurations, including connections and possibly logic functions of a logic array, which effect the specified functional performance characteristics, from specified functional performance characteristics, for example based on a specified functional diagram; and
    applying the determined internal electrical configuration, including the connections and possibly the logic functions, to the logic array by means of software;
    whereby, when the internal electrical connections are able to be freely established within confines of a firmly stipulated preset format independently of the specified total functional performance characteristics.

8. The method according to claim 7 wherein said storage programmable control system includes logic blocks further comprising the step of:
    organizing said logic blocks into groups based on said specified functional performance characteristics.

9. The method according to claim 8 further comprising the step of:
    dividing said specified functional performance characteristics into subfunctions, said subfunctions being realizable in one of said groups of said logic blocks.

10. The method according to claim 8 wherein complex standard subfunctions have internal electrical standard configurations, said internal electrical standard configurations of said complex standard subfunction are predetermined.

11. The method according to claim 10 further comprising the step of:
    realizing said complex standard subfunctions by more than one group of logic blocks.

12. The method according to claim 11 further comprising the step of:
    combining said complex standard functions and said logic functions each other and among themselves in accordance with said specified functional performance characteristics.

* * * * *